United States Patent

Hagl et al.

[11] Patent Number: 5,687,103
[45] Date of Patent: Nov. 11, 1997

[54] POSITION MEASURING DEVICE

[75] Inventors: Rainer Hagl, Altenmarkt; Steffen Bielski, Garching/Alz; Hermann Hofbauer, Trostberg; Robert Wastlhuber, Garching/Alz; Erich Strasser, Trostberg, all of Germany

[73] Assignee: Johannes Heidenhain GmbH, Traunreut, Germany

[21] Appl. No.: 440,446

[22] Filed: May 12, 1995

[30] Foreign Application Priority Data

Oct. 13, 1994 [DE] Germany .......................... 44 36 496.2
Mar. 11, 1995 [DE] Germany ........................ 195 08 834.4

[51] Int. Cl.⁶ .................................................. H03K 13/18
[52] U.S. Cl. ...................... 364/514 R; 364/560; 371/2.1; 371/48.044; 371/67.1
[58] Field of Search .................. 364/474.28, 474.31, 364/514 R, 556, 560, 577, 737, 741; 371/2.1, 48, 67.1, 68.1, 68.2, 68.3

[56] References Cited

U.S. PATENT DOCUMENTS

| 4,183,014 | 1/1980 | McClean et al. . |
| 4,306,220 | 12/1981 | Schwefel et al. . |
| 4,412,206 | 10/1983 | Schwefel . |
| 4,500,933 | 2/1985 | Chan .................. 360/69 |
| 4,611,296 | 9/1986 | Niedermayr . |
| 4,912,476 | 3/1990 | Miller et al. . |
| 4,977,359 | 12/1990 | Sawai et al. ................ 318/561 |
| 5,121,116 | 6/1992 | Taniguchi . |
| 5,258,604 | 11/1993 | Behrens et al. .............. 235/462 |
| 5,548,510 | 8/1996 | Ebert et al. ................. 364/443 |

FOREIGN PATENT DOCUMENTS

| 0 154 654 | 5/1984 | European Pat. Off. . |
| 0 142 112 | 3/1985 | European Pat. Off. . |
| 0 171 579 | 2/1986 | European Pat. Off. . |
| 212 118 | 3/1987 | European Pat. Off. . |
| 0 369 031 | 8/1993 | European Pat. Off. . |
| 0 575 843 | 12/1993 | European Pat. Off. . |
| 27 58 525 | 6/1979 | Germany . |
| 28 49 934 | 7/1979 | Germany . |
| 29 38318 | 3/1981 | Germany . |
| 33 22897 | 1/1985 | Germany . |
| 34 42 247 | 5/1986 | Germany . |
| 37 34 938 | 5/1989 | Germany . |
| 39 36452 | 5/1991 | Germany . |
| 41 20 343 | 12/1992 | Germany . |
| 41 29577 | 3/1993 | Germany . |

OTHER PUBLICATIONS

Pinto, J., "'Chicken-Brain'" I/O-Architecture for 'Truly' Distributed Control, 8131 Advances in Instrumentation and Control 48 (1993) Part 2, pp. 829–841.

Kennel, R., et al., "Datenkommunikation über das Bussystem 'Sercos Interface' Auswirkungen auf Antriebsregelungen in Werkzeugmaschinen," [Data Communication by Sercos interface Influence on drive controls in machine tools] 8130 ATP Automatisierungstechnische Praxis 33, No. 7 (Jul. 1991), pp. 363–368.

Ruess, R., "Sercos–Interface auch für Sensoren und Aktoren," 2087 Elektronik 41 (Sep. 1992), pp. 66–73.

Davies et al., *Computer Networks and their Protocols*, 1979, pp. 4–5.

*Primary Examiner*—Emanuel T. Voeltz
*Assistant Examiner*—Craig Steven Miller
*Attorney, Agent, or Firm*—Brinks Hofer Gilson & Lione

[57] ABSTRACT

The invention concerns a device and a method for serial data transmission. In the position measuring device there is provided a memory, in which specific parameters of the position measuring device are kept. These parameters can be sent on the data line to a processing unit, by which the measurement values are transmitted during the position measurement. By receiving the parameters, the processing unit is adjusted to the connected position measuring device.

22 Claims, 10 Drawing Sheets

5,687,103

1

POSITION MEASURING DEVICE

BACKGROUND OF THE INVENTION

The invention concerns a position measuring device, in particular, a device and a method for serial data transmission between a position measuring device and a processing unit, for example, an NC control system.

Such an arrangement is known from EP-0 171 579 B1. The position measurement values of the position measuring device are transmitted to a processing unit, synchronized at a speed dictated by this processing unit. With such an arrangement the processing unit of the user must be adjusted to the specific parameters of the position measuring device in a costly manner. Thus, for example, the number of cycles necessary for complete transmission of a position measurement value depends on the resolution of the position measuring device. Thus far, a fixed number of cycles (e.g., 13) has been specified by the processing unit. If, now, a position measuring device with low resolution (e.g., 5 bits) is used, the 13 cycles will still be used for transmission of the measurement value. Obviously, unnecessary transmission time is being consumed.

A method for adapting a numerical control system to specific parameters of a position measuring device is known from DE 39 36 452 A1. The specific parameters are kept in an information carrier and transmitted to the control system during a trial run.

A position measuring device is known in DE 41 29 577 A1, in which a data storage with system-specific data is integrated. The outputs of the data storage, as well as the outputs of the sampling units, can be switched temporarily to transmission lines. The drawback here is that no synchronization between measurement device and evaluating unit is provided. Furthermore, the absolute value must first be generated in the processing unit, for example, by forming the arctan, which increases the expenditure of processing time. In addition, multiplexers are needed for the transmission. The sending of parameters is provided exclusively when the power supply of the measuring device is turned on.

Therefore, it is desirable to optimize the adaptation of the processing unit to specific parameters of the position measuring device and to minimize the expenditure of transmission lines between the position measuring device and the processing unit, as well as to provide trouble-free position measuring.

An advantage of the present invention is that the specific parameters of the position measuring device can be received independently by the processing unit, making use of the same lines for transmission of these parameters as are already available for the transmission of the measurement value. Furthermore, a correct and virtually faultless position measurement is secured.

SUMMARY OF THE INVENTION

According to a first aspect a position measuring device with a device for serial data transmission between the position measuring device and a processing unit is provided. The position measuring device includes a component with a connection logic, in which a binary code word defining the absolute position is formed from the sampling signals of at least one sampling device, which can be taken to an output component, which causes a bit-serial transmission of the code word across a data line by a command (status) of the processing unit. The position measuring device also has several memory regions, and specific parameters of the position measuring device are saved in one memory region, which can also be transmitted serially to the processing unit across said data line, by means of which the processing unit can be adapted to these parameters. The position measuring device also has another memory region is used for decoding commands (status) of the processing unit, and these commands (status) can also be taken as binary data words serially to the position measuring device on said data line. Furthermore the digital sampling signals can also be taken to the processing unit while bypassing the connection logic.

According to a second aspect a method for serial data transmission between a position measuring device and a processing unit is provided. The method includes transmitting commands (status) bit-serially as data words from the processing unit to the position measuring device. Instructing the position measuring device to either execute a command (status), and to send a position measurement value as a binary data word or a parameter saved in the position measuring device as a binary data word to the processing unit in dependence on the command (status), or receive parameters from the processing unit and store them in a memory region, the commands (status), the parameters, and the position measurement values being transmitted on a common data line.

According to a third aspect a position measuring device with a device for serial data transmission between the position measuring device and a processing unit is provided. The position measuring device includes a component with a connection logic in which a binary code word defining the absolute position is formed from the sampling signals of at least one sampling device, which can be sent to an output component, which brings about a bit-serial transmission of the code word across a data line by a command (status) of the processing unit, there being another connection logic provided in the processing unit with the same function as the connection logic, and the digital sampling signals can also be sent to the processing unit bypassing the connection logic, so that the transmitted data word is compared to the data word formed in the processing unit, and an error signal is put out if the data words are found not to agree.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
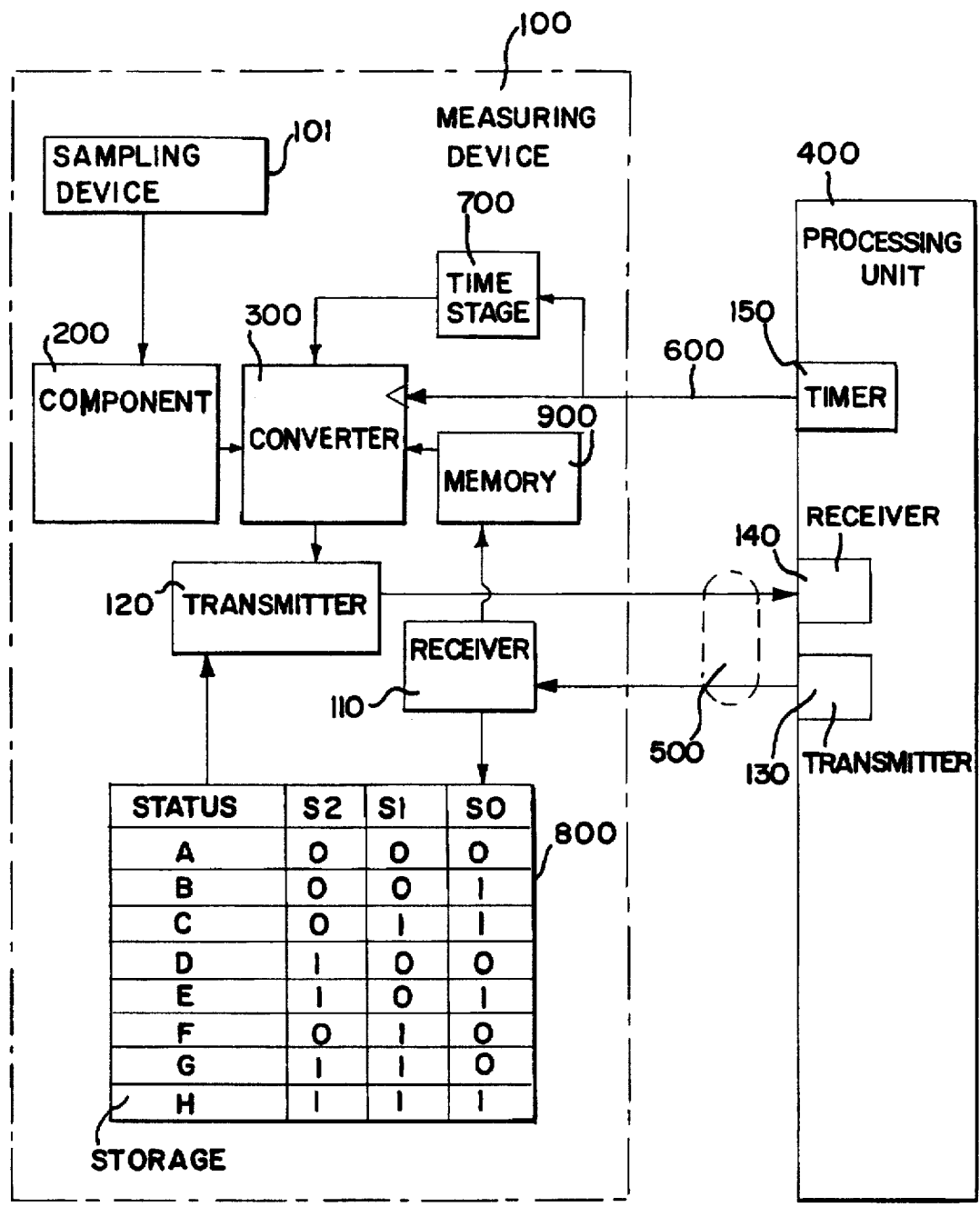
FIG. 1 is a schematic of an arrangement for serial data transmission of an angle measuring device.

In the sample embodiment represented by FIG. 1, the reference number 100 designates an angle measuring device, which transmits the particular absolute angle position as a binary data word (dual code) to a processing unit 400. By familiar photoelectric scanning of a code disk or several code disks (multiturn) connected to each other via a transmission gear, analog sampling signals are generated by a sampling device 101, which are taken to a component 200. In this component 200, the sampling signals are amplified and converted into digital signals for a binary data word. The component 200 guarantees that, regardless of the existing code of the code disk, the complete and absolute position value is output. The code of the code disks can be constructed like Gray Code or from several incremental tracks with defined different division periods such as that described in DE 41 25 665 A1. The component 200 can also be used for correction of the analog or digital signals, as well as carry out the necessary computations necessary for the correct connection or correct combination of several code tracks or groups of code tracks. These computations are described in detail, for example, in U.S. Pat. Nos. 4,306,220 and 4,412,206 which are hereby incorporated by reference (corresponding foreign counterparts DE 27 58 525 B1 and DE 29 36 318 C3) or DE 37 34 938 C2.

The absolute position measurement value is taken to a parallel/serial converter 300 as the output component, which is controlled by a timing pulse sequence and sends the individual bits of the data word determining the absolute position measurement value serially to the processing unit 400 via the data line 500. It is especially advantageous when the timing pulse sequence is specified by the processing unit 400. A timing line 600 is provided to transmit the timing pulses from the processing unit 400 to the angle measuring device 100. The position measurement value is transmitted by means of a retriggerable time stage 700, as explained in detail by EP 0 171 579 B1, to which attention is expressly drawn.

According to the invention, commands from the processing unit 400 to the position measuring device 100 are also transmitted across the data line 500. The commands are taken to a storage 800 of the position measuring device 100, which decodes the command and permits the position measuring device 100 to execute the particular command. This command, in the example, is a data word of three status bits S2, S1 and S0. To assure the transmission of status commands, each status bit is also sent inverted, so that a total of six status bits S2, S1, S0, S2, S1, S0 for one command are transmitted from the processing unit 400 to the position measuring device 100. If the position measuring device 100 recognizes a faulty status bit transfer, an error message is produced. The position measuring device 100 shall be known hereafter as the measuring system.

In a preferred embodiment, eight status commands A through H are indicated, which shall be described hereafter in detail:

1. Status Command A

If the data word A is sent from the processing unit 400 to the position measuring device 100 across the data line 500, this means that the measuring device 100 is instructed to send an absolute position measurement value to the processing unit 400. The transmission protocol for this is shown in FIGS. 3–6 and shall be described in detail later on.

2. Status Command B

By this command, the selection of a memory region is enabled. The measurement device 100 contains a memory 900 in which parameters of the measuring device 100 can be saved. Additional memories or memory regions can be provided for correction values. It is also possible to provide a region in the memory 900 where the user saves specific user parameters, e.g., motor data. It is especially advantageous if the memory 900 is partitioned so that the region with the parameters of the measurement system 100 can only be described by the measurement system manufacturer, and another region is freely accessible to the user (readable and writable). The region with the parameters of the measurement system manufacturer can be partitioned in turn, namely, into a region readable by the user and a region exclusively readable by the measurement system manufacturer.

Figure 2:
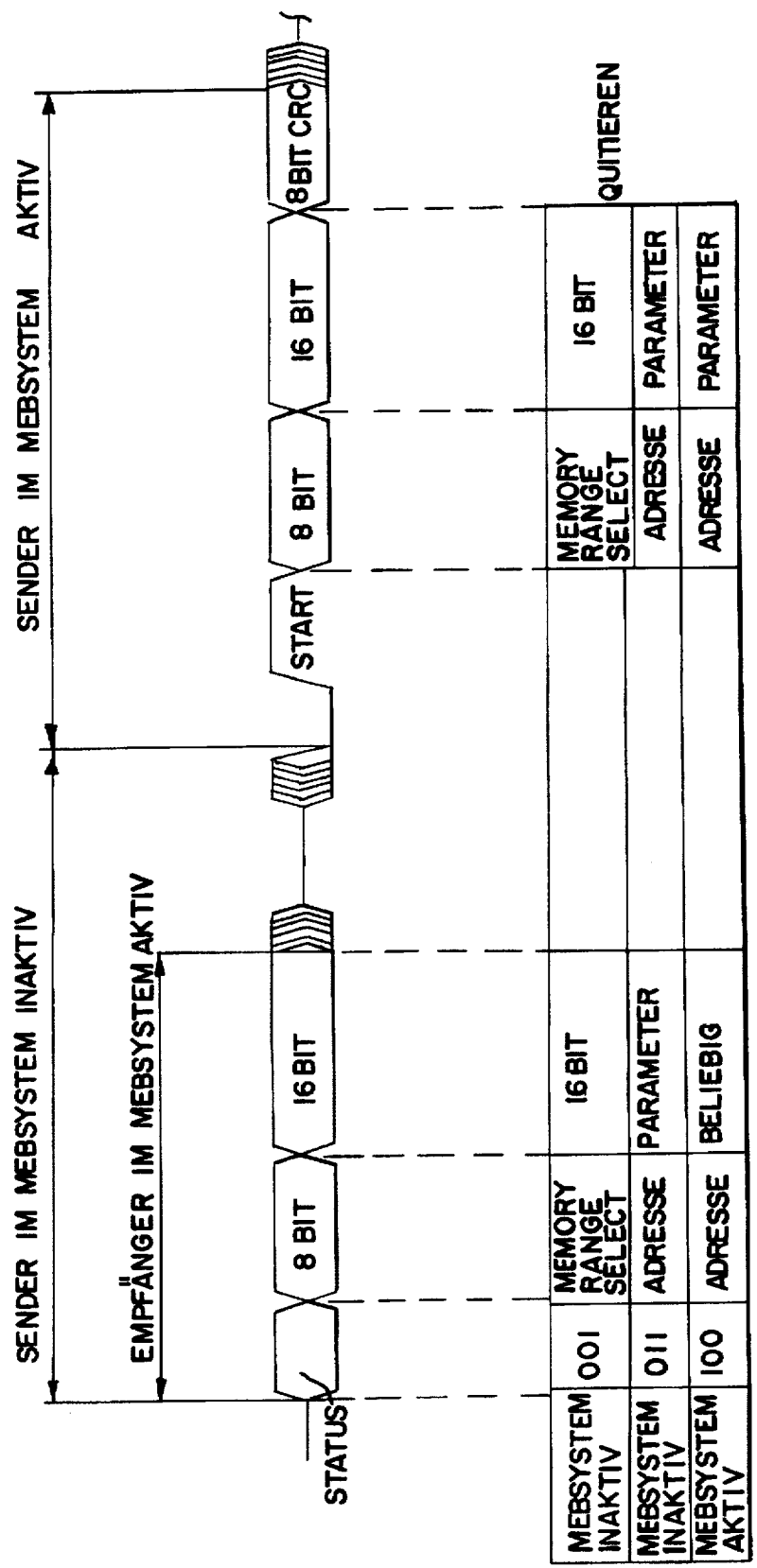
FIG. 2 is a transmission protocol for the parameter transmission.

As can be seen in FIG. 2, in order to read or write parameters, the memory selection is first activated with the command B. After the command B, a 16 bit data word (Memory Range Select Code) is sent from the processing unit 400 to the measurement system 100, in order to select a region of the memory 900. The command is acknowledged by the measurement system.

3. Status Command C

If a particular memory region has been selected with the command B, this command C informs the measurement device 100 that parameters shall be supplied to the measurement system 100 under a particular address. This means that, after this status command C, first the address information under which the parameters are to be saved and then the parameter information shall be sent from the processing unit 400 across the data line 500 to the measurement device 100.

4. Status Command D

If a particular memory region has been selected with the command B, this command D informs the measurement device 100 that the processing unit 400 is awaiting the sending of saved parameters to the measurement device 100. In addition, the processing unit 100 indicates the address where these parameters are saved in the measurement device 100.

5. Status Command E

With this command E, certain regions of the memory 900 can be erased on instruction of the processing unit 400.

6. Status Commands F–H

These commands are reserved advantageously for the testing of the measurement device 100. Thus, for example, it is possible to test a measurement system 100 with integrated error monitoring from a great distance and diagnose the error. For example, after the command F, the processing unit 400 can be examined under a predetermined address of a memory region of the memory 900 to see whether an error message has been saved there. This error message is then sent from the measurement system 100 to the processing unit 400 across the data line 500.

FIG. 2 shows the transmission protocol of the parameter transmission. As can be seen, during the time in which the status bits, the addresses, and the parameters are being sent from the processing unit 400, the receiver 110 in the measurement system 100 is active and the transmitter 120 in the measurement system 100 is inactive. Likewise, as can be seen, the data transmitted with commands B and C are acknowledged by resending these data to the processing unit 400. If the processing unit 400 determines that the data transmitted differ from the data received, the transmission is repeated. In addition to the data, an 8 bit CRC is also transmitted by the measurement system. CRC stands for cyclic redundancy check, and this data word is obtained by a familiar logic operation on the data bits. This transmission of the CRC allows the processing unit 400 to check whether the data transmission was error-free. For purposes of clarity, the inverted status bits are not shown in FIG. 2.

In FIG. 1, the transmitter of the processing unit 400 is designated by 130 and the receiver by 140. Likewise, as can be seen, the timer 150 is accommodated in the processing unit 400. The processing unit 400 or follow-up electronics is preferably a NC-control. For better comprehension, two pathways for the data line 500 are indicated in FIG. 1. According to the invention, the data are transmitted in both directions, but on the same line 500, i.e., bidirectionally, as is also represented in detail in FIG. 4.

FIGS. 3–6 show pulse diagrams for transmission of the position measurement value of the measurement device 100. During the resting state, the data line 500 is at LOW. It is therefore possible to recognize from the processing unit 400 that the connected position measuring device 100 is an arrangement according to the invention, since the data line in the resting state of the arrangement according to EP 0 171 579 B1 is at HIGH.

At the first negative timing pulse edge, the analog values of the sampling device 101 are saved in component 200. If the necessary computations have been completed in component 200, which is indicated by the calculation time to, the measurement device 100 puts out a start signal in the form of a start bit to the processing unit 400, this being synchronized with a positive timing pulse edge. The time $t_c$ is variable and depends on the amount of computations. The start bit indicates that a valid position measurement value is ready for transmission.

After the start bit, an alarm bit is sent. The alarm bit reports a malfunction of the measurement device 100 to the processing unit 400. An error message is put out if an error message has been saved in the memory 900. The reason for the alarm can be read out from the memory 900.

With the next positive timing pulse edge, the data bits of the measurement value waiting at the parallel/serial converter 300 are sent serially from the transmitter 120 across the data line 500 to the processing unit 400. The length of the measurement value, i.e., the necessary number of cycles, was reported to the processing unit 400 prior to transmission as parameters from the memory 900. In order to check on the transmission of the measurement value, a CRC (cyclic redundance check) is also transmitted. The formation of a CRC is familiar from data processing.

Figure 3:
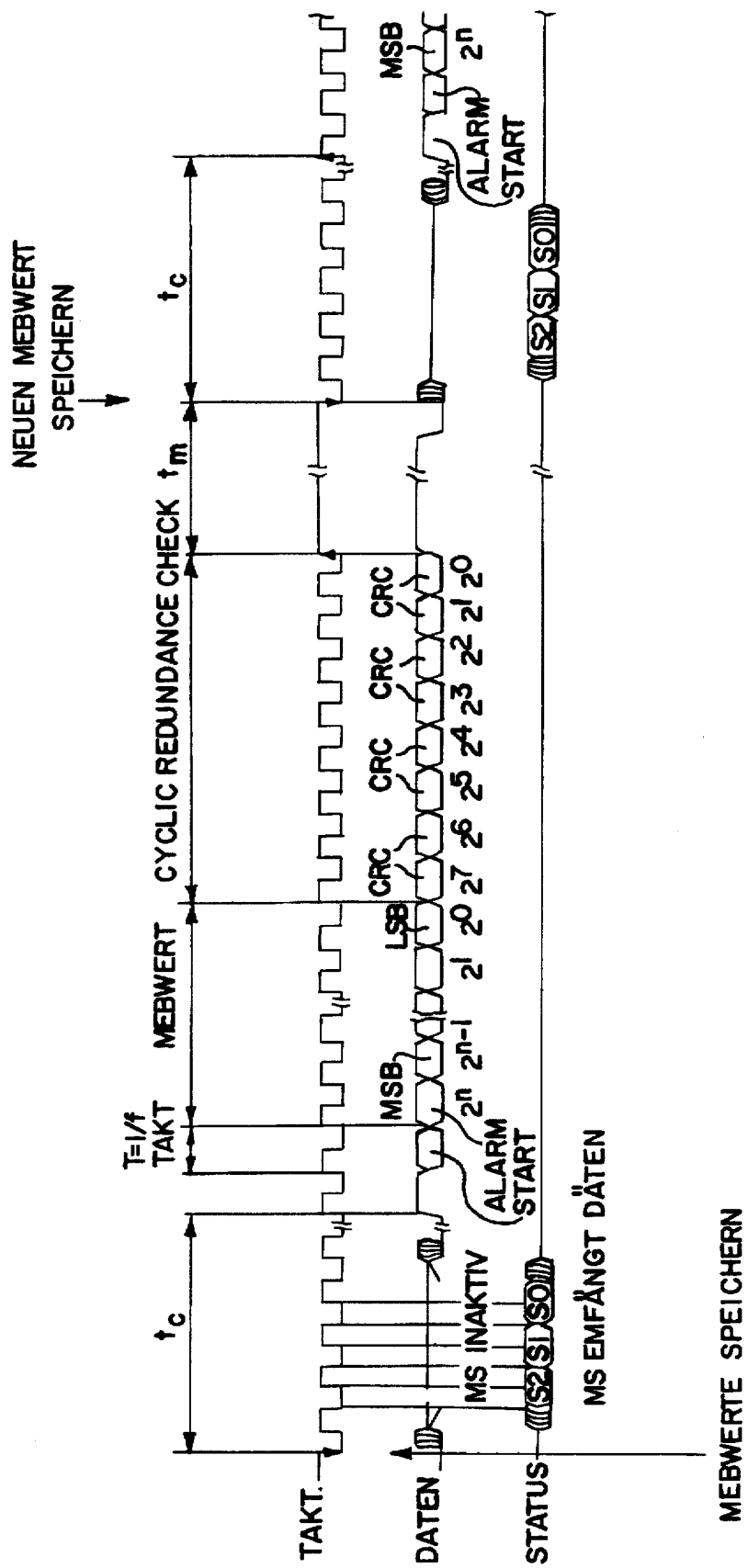
FIG. 3 schematically shows the sequence of the synchronous serial data transmission in a pulse-time diagram.
Figure 4:
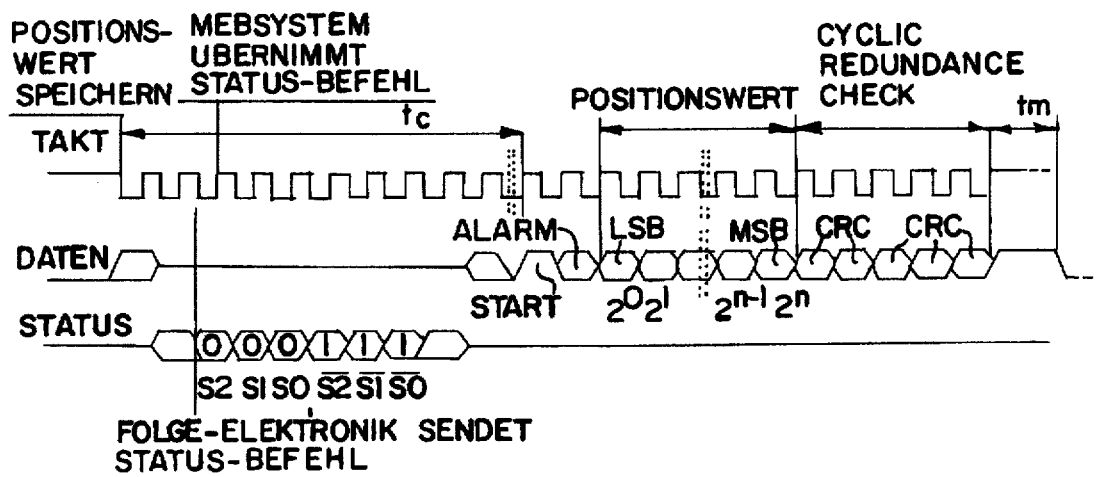
FIG. 4 is another data transmission sequence.
Figure 5:
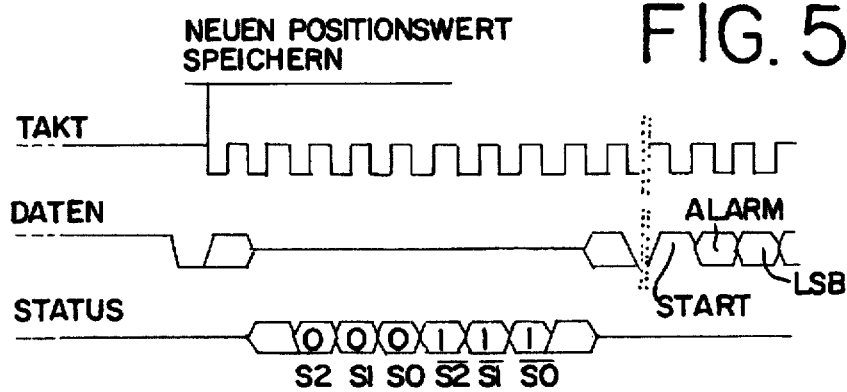
FIG. 5 is the data transmission with intermittent cycle.
Figure 6:
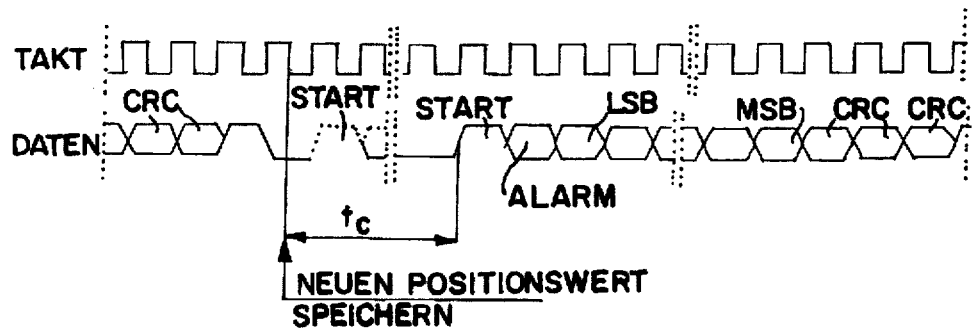
FIG. 6 is the data transmission with continuous cycle.

In the sample embodiment per FIG. 3, the MSB is sent first and the LSB of the measurement value is sent last. In the sample embodiments according to FIGS. 4–6, on the other hand, the LSB is sent first. In FIGS. 4 and 5, the inverted status bits are also shown. If the LSB is sent first, it is possible to implement a fast bit-serial binary subtraction and addition for the zero offset without much expense during the transmission. Furthermore, this transmission has advantages in code value connect computations per U.S. Pat. Nos. 4,306,220 and 4,412,206 and DE 37 34 938 C2, since the code value of less resolution is dependent on the code value of greater resolution.

After a particular time $t_m$, another saving of a measurement value and transmission occurs. Once again, the status information is sent from the processing unit 400 to the measurement device 100 during the calculation time $t_c$.

A distinction is drawn between intermittent and continuous cycles in the transmission of the position measurement value. As an illustration, these two operating modes are represented in detail in FIGS. 5 and 6. The intermittent cycle per FIG. 5 is characterized in that the cycle is interrupted after the CRC transmission until a new position measurement value is saved. The processing unit 400 sends a status command before each transmission of a position measurement value to the processing unit 400. The intermittent cycle is especially designed for systems with timing, such as control circuits. If another measurement value is supposed to be sent in the shortest possible time, it is also possible to select the operating mode of FIG. 6, "continuous cycle." This economizes on the waiting time $t_m$, as well as the time for transmission of the status information. The last-transmitted status information is used as the current status information in the processing unit 400.

As can be seen from FIGS. 3–6, the processing unit 400 sends a status bit synchronized with the decreasing timing pulse edge. The measurement system 100 receives the status bit synchronized with the rising timing pulse edge.

Figure 7:
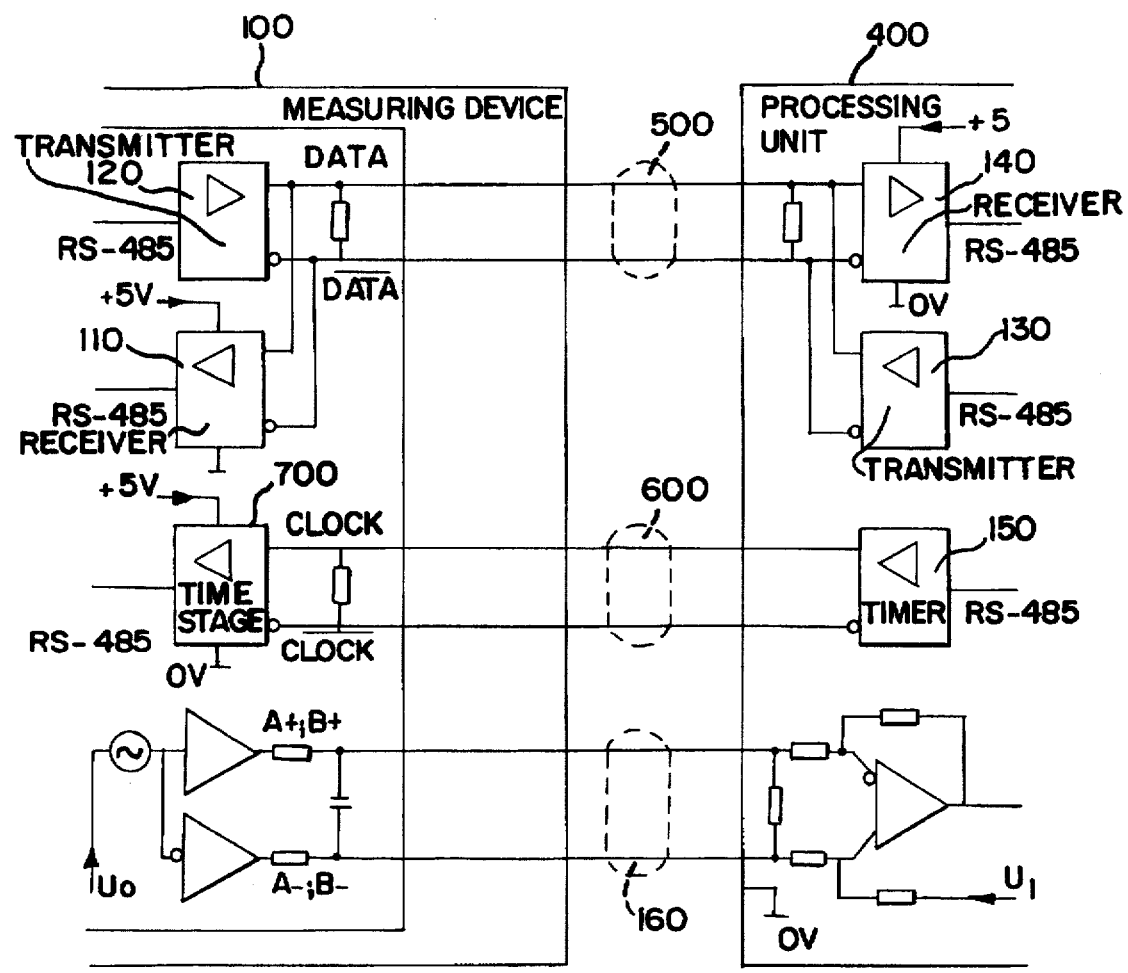
FIG. 7 is a circuit for bidirectional data transmission.

In order to allow the arrangement to be used for serial transmission of as many possible measurement devices, in addition to the data line 500 and timing line 600 there are additional lines 160 provided for transmission of analog or binary counting signals of an incremental position measuring device (FIG. 7). Thus, in parallel with the absolute measurement value transmission on the data line 500, it is also possible to send the counting signals on the line 160 to the processing unit 400. As can also be seen in FIG. 7, the bidirectional transmission of data (measurement values and parameters) between the measurement device 100 and the processing unit 400 occurs with signal levels per RS485 (difference signals), in synchronization with a timing signal (CLOCK) specified by the processing unit 400. The timing frequency is between 100 kHz and 2 MHz.

As already mentioned, the memory 900 allows both the customer and the manufacturer of the measurement device 100 to read and write parameters in the measurement device 100. It is advantageous if the memory 900 is partitioned into several regions, such as memory region for customer parameters, memory region for parameters of the measurement system manufacturer, and memory region for correction values. In a preferred embodiment, the memory region of the measurement system manufacturer is write-protected. The individual memory regions are distinguished by the "memory range select" code.

The memories can be loaded as follows:

I. Memory Assignment, Customer Parameters

1. Zero offset

The value is subtracted from the zero point of the measurement system 100.

II. Memory Assignment, Parameters of the Measurement System Manufacturer

These parameters can contain data permanently specified by the manufacturing process, but also additional information on the operating condition and on operational parameters.

1. Version

The version indicates how the memory 900 is partitioned.

2. Memory Size

Indicates the size of the individual regions of the memory 900.

3. Transmission Format

Indicates the number of cycles for transmission of a measurement value (data word).

4. Measurement System Type

Indicates whether an incremental length or angle measuring system with or without distance-coded reference marks, or whether a single turn or multiturn shaft encoder is used.

5. Signal Period or Signal Periods Per Revolution

Indicates the width of a signal period in length measuring systems or the number of signal periods per revolution in angle measuring systems.

6. Number of Distinguishable Revolutions

In multiturn code angle measuring systems, the distinguishable revolutions are indicated.

7. Basic Distance for Distance-Coded Reference Marks, or Distance Between Two Neighboring Reference Marks In measurement systems with distance-coded reference marks, this provides an indication of the basic distance of the respective reference marks. In measurement systems without distance-coded reference marks, this provides the indication of the spacing between two neighboring reference marks.

8. Position of the First Reference Mark

Indicates the position of the first reference mark relative to the end position.

9. Measurement Step or Steps

Indicates, in length measuring systems, the measurement step that is put out by the measurement system in the serial data transmission. In angle measuring systems, it indicates the number of measurement steps per revolution.

10. Zero Offset of the Measurement System Manufacturer

11. Direction of Turning and Code Output for Code Angle Measuring Systems

12. ID Number of the Measurement System

13. Serial Number of the Measurement System

14. Alarms

Errors which occur are saved in memory. If, for example, a bit is not equal to zero, the alarm bit is set when the measurement values are transmitted according to FIG. 3. An alarm message can also be used for emergency shutoff of a drive.

5. Warnings

If preset tolerances for particular internal magnitudes of the measurement system are exceeded, which might result in breakdown of the measurement system, these are saved in the form of warning messages and can be read out on demand. In the case of battery-operated measurement systems, a warning message might be the phrase "battery change," for example. Thus, warnings enable a preventive maintenance.

III. Memory Assignment, Correction Values

1. Number of Correction Values in Terms of the Measurement Length

2. Number of Correction Values for Signal Deviations, Such as Signal Amplitudes, Phase Mismatch, and Zero Point Deviations 3. Number of Correction Values for Harmonics 4. Number of Harmonics to be Corrected 5. Correction Values for 1

6. Correction Values for 2

7. Correction Values for 3

Of course, other parameters can also be made available for the processing unit 400 in the memory 900 within the context of the invention. When setting up the system, the processing unit 400 is adjusted by receiving the necessary parameters from the measurement system 100 across the data line 500.

The regions of the memory 900 can be partitioned by software, but it is also possible for the memory 900 to consist of several individual memory components.

As is evident, the arrangement according to the invention has the following advantages. It can be used with both code measuring systems and incremental measuring systems. In addition, transmission times for the absolute position value are minimized. For applications in a control closed circuit, this reduces dead time and provides an improved control behavior. It also provides bidirectional interface with the ability to read and write parameters in the measurement system for both the customer and the measurement system manufacturer (simplified setup). It also supports the monitoring and diagnostic functions of the processing unit. For absolute measurement systems, there is a transmission of complete absolute values in dual code, regardless of the type of determination of the absolute position measurement value, so that a different evaluation in the processing unit is not required. The format for transmission of the position measurement value is variable in its length and depends on the particular measurement system. The determination of the number of cycles and the coordination of the position measurement value with the cycles is done by sampling the content of the memory in the measurement system.

As is evident from the preceding remarks, it is especially advantageous when the cycle is specified by the processing unit 400. This ensures a synchronized data transmission.

However, the invention can also be used when the cycle is determined by the measurement system 100. In this case, a request signal is sent to the measurement system 100 by the processing unit 400 across the timing line 600. Thereupon, the bits of the position measurement value are sent serially across the data line 500 to the processing unit 400 in synchronization with an internal clock cycle. In order to provide a transmission synchronized with the processing cycle of the processing unit 400 once more, the internal clock of the measurement system 100 can be synchronized with one edge of the request signal. The request signal can also be sent to the measurement system 100 across the data line 500.

For a distinct connection of high-resolution code groups to low-resolution code groups, a read-only memory is provided according to U.S. Pat. No. 4,412,206. The digitized sampling signals are put into the read-only memory. The read-only memory puts out a code word determining the absolute position for further processing in a numerical control.

An angle measuring system is known from DE-37 34 938-C2 in which the angle position of a shaft is determined after several revolutions by means of a multistage angle encoder. A digital code word is formed from the analog sampling signals of each code disk. An evaluation unit is provided for the synchronization of these code words, so that the angle encoder puts out a code word determining the absolute position for direct processing at a numerical control.

Furthermore, an absolute position measuring system is described in U.S. Pat. No. 5,121,116 which is specifically incorporated by reference (corresponding foreign counterpart EP-0 369 031-B1) in which several code words are formed from the analog sampling signals, and from them a code word defining the absolute position is formed by synchronization of the code words.

Thus, in these position measuring systems, the overall evaluation of the analog sampling signals occurs within the position measuring system. A faulty synchronization of the sampling signals cannot be recognized by a connected follow-up electronics (numerical control).

In a further preferred embodiment of the present invention, it should be possible to reliably recognize a malfunction of the position measuring device from a connected external device.

Figure 8:
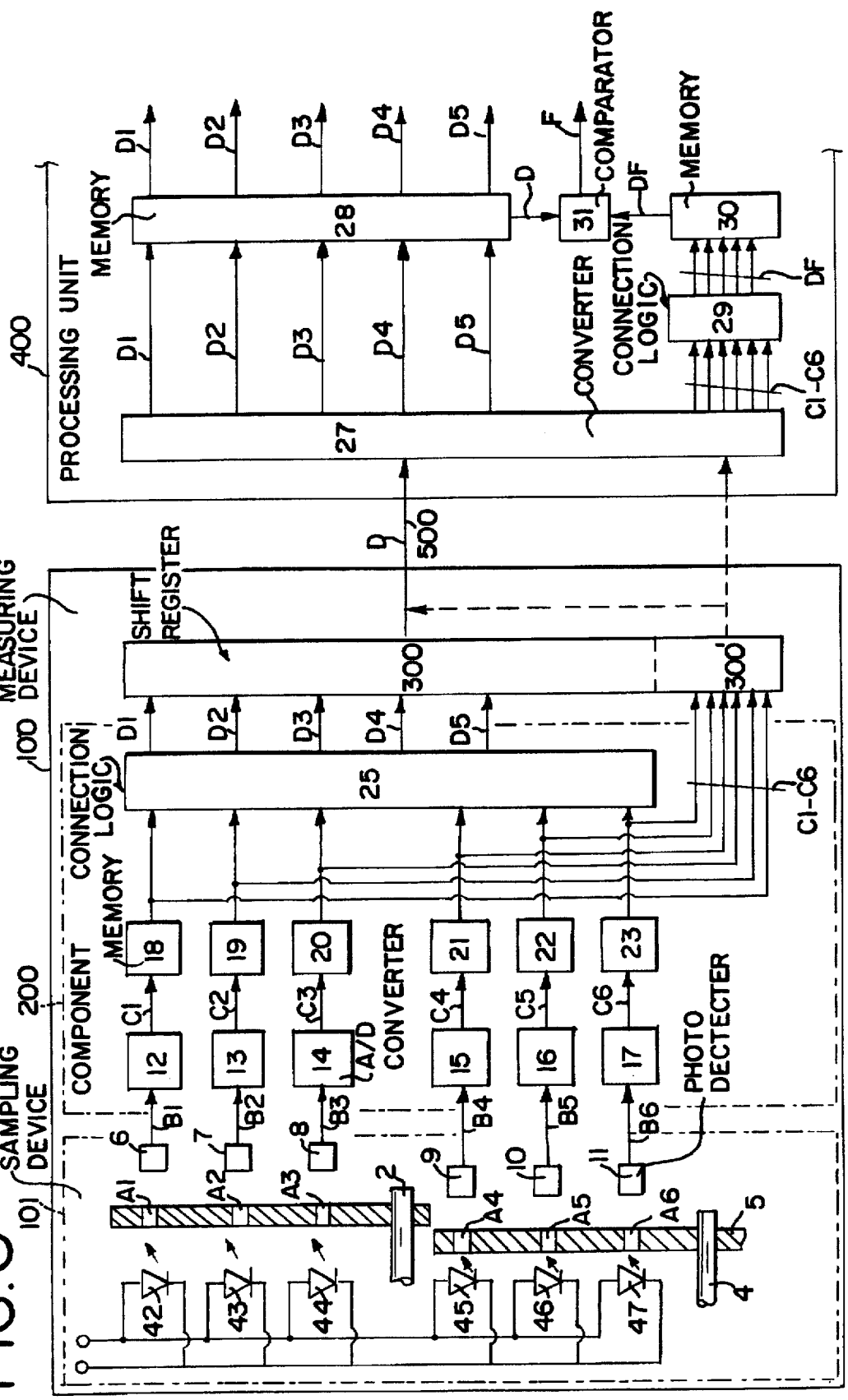
FIG. 8 is an angle measuring device with error monitoring.

The angle measuring device 100 per FIG. 8 consists of an input shaft 2, on which a first code disk 3 with three code tracks A1, A2, A3 is mounted, which is photoelectrically sampled in familiar fashion in order to determine the absolute position of the input shaft 2 within one revolution.

The input shaft 2 is coupled to another shaft 4 with a second code disk 5 by means of a reducing transmission, not shown. This code disk 5 also has three code tracks A4, A5, A6, which are also photoelectrically sampled. The encoding is done preferably in Gray Code. All code tracks A1–A3 of the first code disk 3 form a first code group and all code tracks A4–A6 of the second code disk 5 another code group, the first code group having a higher resolution than the second code group. Photodetectors 6–11 are provided for sampling the code tracks A1–A6 and putting out analog sampling signals B1–B6.

Figure 9:
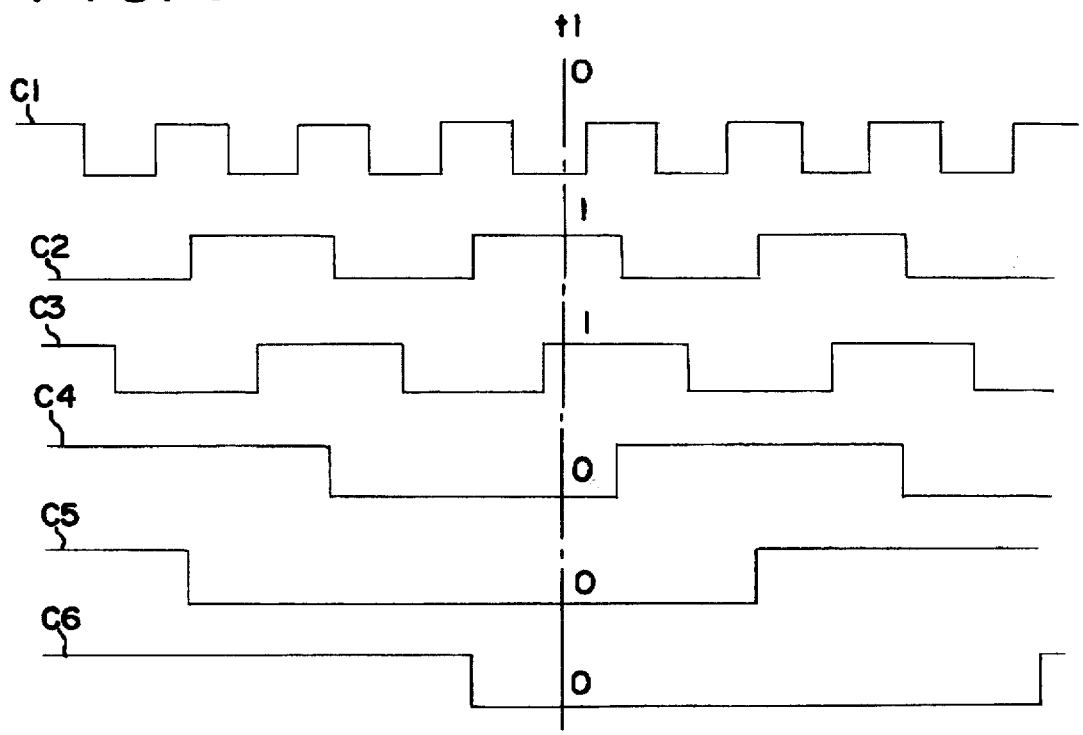
FIG. 9 is a signal diagram.
Figure 11:
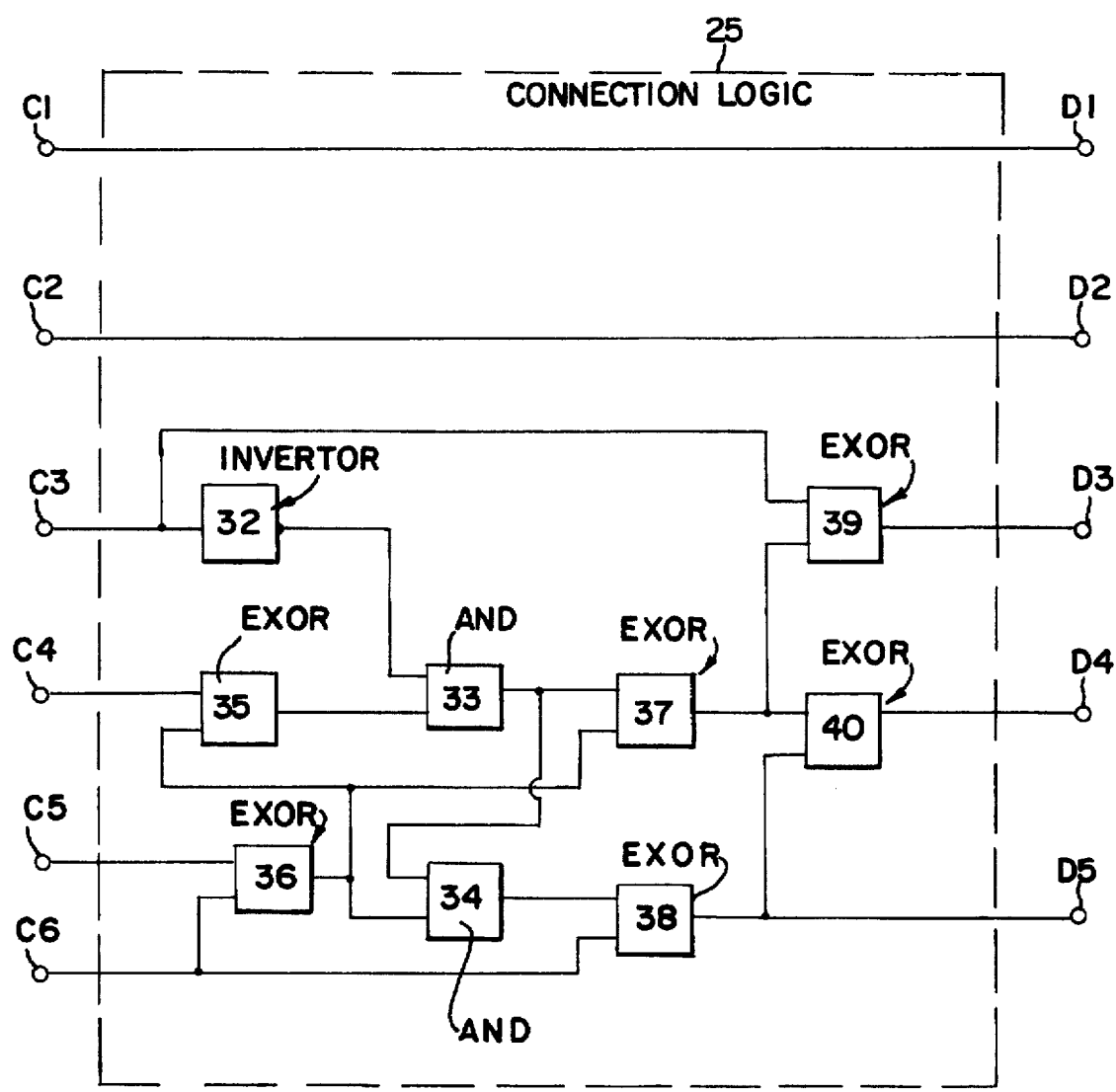
FIG. 11 is a connection logic.

For the triggering of these sampling signals B1–B6, A/D converters 12–17 are arranged in the angle measuring device 1, which put out the digital sampling signals C1–C6 represented in FIG. 9. Memory components 18–23 are provided for saving these digital sampling signals C1–C6. The digital sampling signals C1–C6 are saved at time $t_1$ on request of a follow-up electronics 400 and sent in parallel mode to a connected logic 25. The layout of such a connection logic 25 is represented in FIG. 11 and shall be explained in greater detail below.

Figure 10:
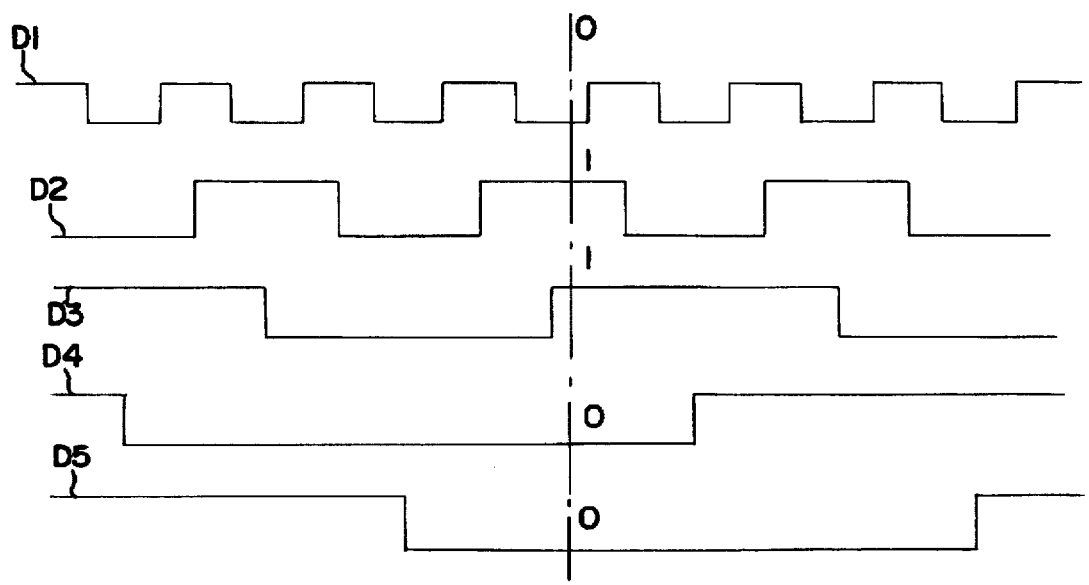
FIG. 10 is another signal diagram.

From the six digital sampling signals C1–C6, a code word D consisting of five bits is formed by synchronization in the connected logic 25. The signals D1–D5, which define this code word D, are shown in FIG. 10. This code word D directly defines the absolute position of the input shaft 2 over several revolutions in Gray Code and it is transmitted in serial mode to the follow-up electronics 400. A shift register 300 is provided for the parallel/serial conversion. The follow-up electronics 400 is, for example, an NC control, which controls the movement processes in dependence on the code word D, which defines the absolute position.

According to the invention, the angle measuring device 100 is designed to transmit, besides the code word D, also the saved digital sampling signals C1–C6 to the follow-up electronics 400. The digital sampling signals C1–C6, bypassing the connected logic 25, are also taken to the shift register 300 as an interface component and transmitted in serial mode. As shown by hatched lines in FIG. 8, an additional shift register 300' can also be used for the transmission, in which case the transmission to the follow-up electronics 400 occurs in serial mode on the same line 500 as the code word D, or with greater wiring expense in parallel mode (shown by broken line) on special lines.

As can be seen from FIG. 8, the code word D is converted from serial to parallel in the follow-up electronics 400 by means of the converter 27 and taken to a memory component 28. Likewise, the digital sampling signals C1–C6 are serial-parallel converted by means of the converter 27 and taken to a connection logic 29. This connection logic 29 has the same function as the connection logic 25 integrated in the angle measuring device 100. It is especially advantageous if the connection logic 29 in the follow-up electronics 400 is accomplished by software. The connection logic 29 synchronizes the digital sampling signals C1–C6 and forms the code word DF, which is taken to a memory component 30. The code word D and the code word DF are taken to a comparator 31. The comparator 31 checks both code words D, DF for identity. If it is determined that the code words D, DF are different, an error signal F is output, which signals a malfunction of the angle measuring device 100, especially the connection logic 25, to the follow-up electronics 400.

If two separate interface components 300 and 300' are used for transmission from the angle measuring device 100 to the follow-up electronics 400, a malfunction of the interface components 300, 300' can also be recognized by the follow-up electronics 400.

FIG. 11 shows an example of the connection logic 25. The digital sampling signals C1–C3 of the high-resolution code group are logically connected to the digital sampling signals C4–C6 of the low-resolution code group in this connect logic 25. As a result of this logic operation, one bit is lost in the depicted example, so that six bits are put in and five bits are put out. The logic operation depicted is familiar in itself and shall only be briefly explained. As can be seen from FIG. 9, the first two maximum-resolution sampling signals C1 and C2 form a Gray Code and the third sampling signal C3 is phase-shifted by 90° relative to the second, but has the same signal period as the sampling signal C2. This sampling signal C3 is used for synchronization, i.e., correct connection of the sampling signals C1–C3 and C4–C6 of the two code groups. The code track A3, which is used to form the sampling signal C3, is therefore also known as the connection track. When there is play in the reducing gear, the edges of the sampling signals C4–C6 are shifted with respect to the nominal position shown. In order to allow an unavoidable gear play, sampling signals D3, D4, D5 are generated from the lowest-resolution sampling signal C3 of the higher-resolution code group and from the sampling signals C4–C6 of the lower-resolution code groups, which form along with the sampling signals D1 and D2 a correct Gray Code. As is graphically explained in FIG. 2 of DE-37 34 938-C2, a correct synchronization is ensured if the gear play lies within a half-period of the lowest-resolution sampling signal C3 of the higher-resolution code group.

The connection logic 25 shown as an example consists of the invertor 32, the AND elements 33, 34, and the EXOR elements 35–40. The function of the connection logic 25 and 29 can be realized in hardware or software, and is not limited to the example shown.

In a way not shown, the memory components 18–23 can also be arranged in front of the A/D converters 12–17 for storage of the analog sampling signals B1–B6.

In the examples shown, a digital sampling signal C1–C6 in the form of a single bit is derived from each analog sampling signal B1–B6. As described in U.S. Pat. No. 5,121,116 and EP-0 575 843-A1, the code tracks can also be configured such that a multidigit data word is already generated from a code track, the absolute position being determined from several data words. The individual bits of the data words are treated like the bits of the digital sampling signals C1–C6 according to the invention, so that each data word can be called a code group.

It is also possible with the invention to shift the individual analog sampling signals B1–B6 individually by applying auxiliary voltages or by regulating the respective light sources 42–47 at definite levels, or to shift the trigger levels of the A/D converters 12–17 and/or the A/D converter 41 in a definite way. By this measure, all signal combinations occurring in the operation can be simulated and the connection logic checked for all signal combinations, as explained above.

The control of the serial transmission of the sampling signals D1–D5 and C1–C6 or B1–B6 occurs from the NC control system via the serial interface shown. The interface is therefore designed as a bidirectional interface.

The transmitted data word D defines the absolute position in the Gray Code, but it is also possible to convert the Gray Code data word D into a binary code prior to the transmission.

The code groups being synchronized can also be adjusted to a single material measure. This may be necessary, since the edges of a sampling signal can be shifted relative to another sampling signal solely by frequency-dependent influences. This shifting occurs, for example, simply by the triggering, owing to the frequency dependence of the trigger stages.

A position measuring device is known from DE 33 22 897 C2, in which several code disks are coupled together via a reducing gear for absolute measurement of a position over several rotations. The code tracks of a code disk each form one code group, the sampling of which produces a code word. By combination of the individual code words of different angle resolution, the absolute position is determined. In order to suppress the effects of gear play, there are known measures for achieving a synchronization between the sampling signals of two consecutive code groups. These measures are explained in detail in DE 33 22 897 C2 and DE 37 34 938 C2 and U.S. Pat. Nos. 4,412,206 and 4,306,220 to which express reference is made.

In all these measures, a correct synchronization between the sampling signals of two code groups is only guaranteed if the mismatch between a fine code group and a subsequent coarse code group is less than half the scale period of the coarsest code track of the fine code group. This means that the reverse play of the reducing gear may shift within the width of one bit of the higher-resolution code group without producing a measurement error. No synchronization is possible for a larger gear play, so that correct position measurement values cannot be output.

Figure 12:
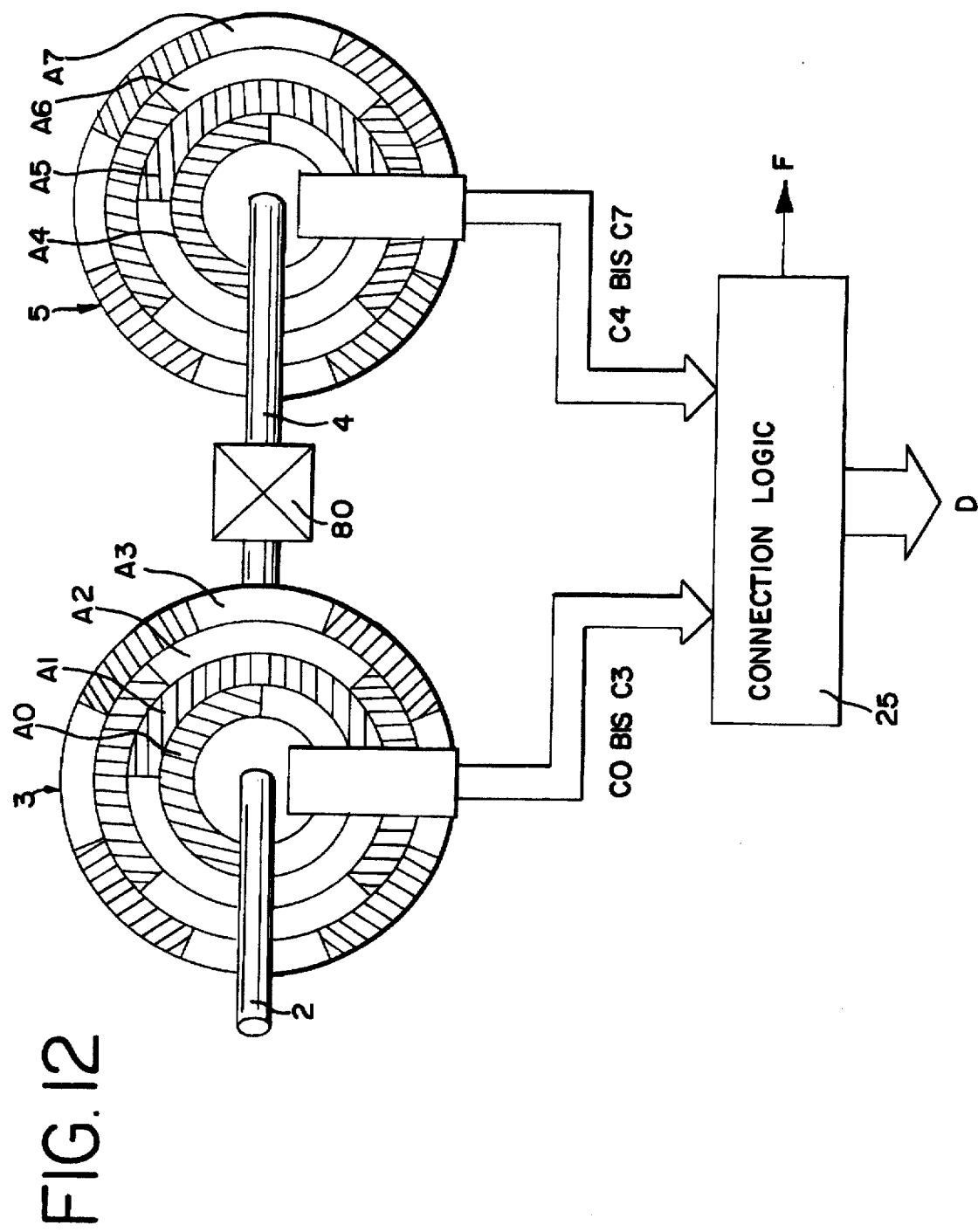
FIG. 12 is an angle measuring device with another error monitoring.

The position measuring device described hereafter shows how faulty measurements can be recognized in good time. The angle measuring device per FIG. 12 consists of an input shaft 2, on which a first code disk 3 with four code tracks A0, A1, A2, A3 is arranged, which is photoelectrically sampled in familiar manner in order to determine the absolute position of the input shaft 2 within one revolution.

The input shaft 2 is coupled by a reducing gear 80 to another shaft 4, on which a second code disk 5 is arranged. This code disk 5 also has several code tracks A4, A5, A6, A7, which are photoelectrically sampled. The coding is done preferably in Gray Code. All code tracks A0–A3 of the first code disk 3 form a first code group and all code tracks A4–A7 of the second code disk 5 form another code group, the first code group having a higher resolution than the other code group.

The analog sampling signals are triggered and taken as digital sampling signals C0–C3 and C4–C7 to an evaluation unit 25 to form the absolute position D. The formation of the absolute position D by synchronization of the sampling signals C0–C3 with C4–C7 is explained in detail in the documents already mentioned at the outset, so that this shall only be taken up briefly to make the invention comprehensible.

Figure 13:
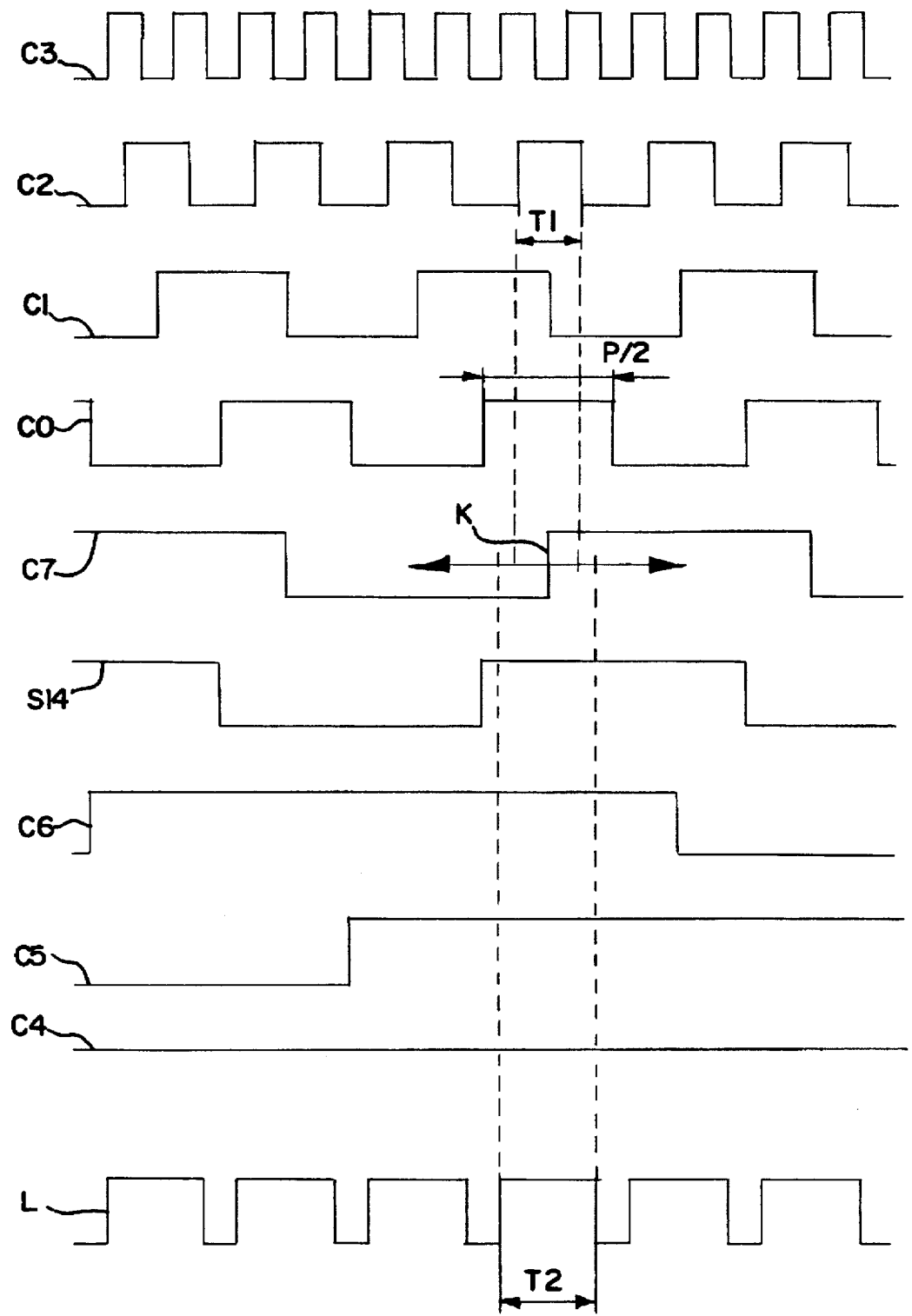
FIG. 13 shows the sampling signals of the angle measuring device of FIG. 12.

FIG. 13 shows the digitized sampling signals of the first code group. As can be seen, the first three highest-resolution sampling signals C1–C3 form a Gray Code and the fourth sampling signal C0 is phase-shifted with respect to the third sampling signal C1 by 90°, but has the same period as the sampling signal C1. This sampling signal C0 is used for synchronization, i.e., correct connection of the sampling signals C0–C3 and C4–C7 of the two code groups. The code track A0, which is used to form the sampling signal C0, is therefore also known as the connection track.

If there is play in the gearing 80, the edges of the sampling signals C4–C7 are shifted relative to the nominal position, which is shown by the example of the sampling signal C7. In order to tolerate an unavoidable gear play, a sampling signal S14 is generated from the worst-resolution sampling signal C0 of the higher-resolution code group and the sampling signals C4–C7 of the worse-resolution code group, which forms together with the sampling signals C3, C2, C1, a correct Gray Code. This synchronization is accomplished with logic circuits or read-only memories in the state of the art. As graphically explained in FIG. 2 of DE 37 34 938 C2, a correct synchronization is only possible if the gear play lies within a half period P of the worst-resolution sampling signal C0 of the higher-resolution code group. In the example according to FIG. 13, the rising edge K of the sampling signal C7 may shift within P/2 of the sampling signal C0. If the shift is greater, a wrong position measurement value D is output.

According to our invention, a check is made as to whether the edge K lies within a predetermined tolerance range T. A tolerance range T1 is formed, for example, by a higher-resolution sampling signal C2 of the higher-resolution code group by checking to see whether the edge K lies within a predetermined logic level (for example, 1) of the sampling signal C2. As soon as the edge K lies within another level (for example, 0) of the sampling signal C2, a warning signal F is put out by the evaluating unit 25.

Another possibility for establishing a tolerance range T2 is to logically combine several sampling signals C2 and C3 with each other. A logical OR operation produces a test signal L. As soon as the edge K is within the logic level 0 of the test signal L, a warning signal F is generated. This testing can be done by means of a computer or by means of logic arrays. It is especially advantageous that a checking of correct function can even be done during the user's operation.

The two code groups being synchronized once again need not be partitioned for separate material measures 3, 5. The invention can also be used in order to synchronize two code groups of different resolution to a single material measure. This may be necessary, since the edge K of a sampling signal C7 can be shifted solely by frequency-dependent influences relative to the sampling signal C0. This shifting occurs, for example, simply from the triggering, due to the frequency dependence of the trigger stages. The shift will increase when there are fast relative movements between the material measure and a sampling unit, so that a monitoring of the permissible velocity, e.g., the number of revolutions, is also possible according to the invention.

The invention can be used with angle or length measuring devices. The sampling principle is not confined to the photoelectric principle. The cede for forming the position measurement value to be transmitted can be provided in a single track (chain code) or in several tracks on one or more code carriers.

Of course, it should be understood that a wide range of changes and modifications can be made to the preferred embodiments described above. It is therefore intended that the foregoing detailed description be regarded as illustrative rather than limiting and that it be understood that it is the following claims, including all equivalents, which are intended to define the scope of this invention.

What is claimed is:

1. Position measuring device with a device for serial data transmission between the position measuring device and a processing unit, the position measuring device comprising a component with a connection logic, in which a code word defining the absolute position is formed from the sampling signals of at least one sampling device, which can be taken to an output component, which causes a bit-serial transmission of the code word across a data line coupling the position measuring device and processing unit in response to a first command (status) sent by the processing unit, the position measuring device also having several memory regions with specific parameters of the position measuring device saved in one of the several memory regions, which can also be transmitted serially to the processing unit across said data line in response to a second command (status) sent by the processing unit, which allows the processing unit to be adapted to these parameters, and another one of the several memory regions is used for decoding commands sent by the processing unit to the position measuring device on said dataline as serial binary data words.

2. Position measuring device according to claim 1 further comprising a clock in the processing unit transmitting clock pulse sequences to a clock input of the output component, wherein the data line is connected to an output of the output component, wherein position measuring values and the parameters can be transmitted, synchronized with the clock pulse sequence, in bit-serial fashion to the processing unit over the data line.

3. Position measuring device according to claim 2 wherein the clock is provided in the processing unit and the clock pulse sequences can be sent to the clock input of the output component across a timing line.

4. Position measuring device according to claim 2 wherein the information as to the number of cycles required for transmission of the position measurement value is saved as specific parameters in one of the several memory regions.

5. Position measuring device according to claim 1 wherein at least one of the several memory regions contains user-specific parameters to which the parameters can be sent from the processing unit to the position measuring device across the data line.

6. Position measuring device according to claim 1 wherein error monitoring is integrated in the position measuring device and at least one of the several memory regions is used to store alarm or error messages which can be read by the processing unit over the data line.

7. Position measuring device according to claim 6, wherein an error message as reason for an alarm can be read out from the memory by a command (status) of the processing unit, and this command (status) can also be taken as binary data word serially to the position measuring device on said data line.

8. Position measuring device according to claim 1 wherein a signal having a LOW level is on the data line when the position measuring device is in a resting state.

9. Method for serial data transmission between a position measuring device and a processing unit, the method comprising the steps of:

transmitting commands (status) bit-serially as data words from the processing unit to the position measuring device; instructing the position measuring device to either execute a command (status), and to send a position measurement value as a binary data word or a parameter saved in the position measuring device as a binary data word to the processing unit in dependence on the command (status), or receive parameters from the processing unit and store them in a memory region, wherein the commands (status), the parameters, and the position measurement values are transmitted on a common data line.

10. Method according to claim 9 wherein the commands (status) parameters, and position measurement values are transmitted in synchronized time by a clock pulse sequence.

11. Method according to claim 10 wherein the clock pulse sequence is transmitted from the processing unit across a timing line to the position measuring device.

12. Method according to claim 11 wherein the information as to the number of cycles required for transmission of a position measurement value is saved in the position measuring device, this information is read by the processing unit, and the required number of cycles for the transmission of the measurement value is provided to the position measuring device by the processing unit.

13. Method according to claim 10, 11, or 12 wherein at one edge of the clock pulse sequence the formation and storage of the particular absolute position measurement value in the position measuring device is brought about and after a predetermined calculation time ($t_c$), a start message is transmitted from the position measuring device to the processing unit, after the start message, an alarm message and/or an error message is transmitted to the processing unit, and subsequently the data word of the position measurement value is transmitted to the processing unit.

14. Method according to claim 9 wherein a memory region is provided in the position measuring device, in which error information is saved in event of error or exceeding of set tolerances, which is read out on request of the processing unit.

15. Position measuring device with a device for serial data transmission between the position measuring device and a processing unit, the position measuring device comprising: a component with a first connection logic in which a code word defining the absolute position is formed from the sampling signals of at least one lower-resolution code track with at least one higher-resolution code track, which can be sent to an output component, which brings about a bit-serial transmission of the code word across a data line coupling the position measuring device and processing unit in response to a command (status) sent by the processing unit, there being a second connection logic provided in the processing unit with the same function as the first connection logic, and sampling signals can also be sent directly to the processing unit by bypassing the connection logic wherein the sampling signals are converted to a data word by the second connection logic, so that the code word is compared to the data word formed in the processing unit, and an error signal is output if the code word and data word do not agree.

16. Position measuring device according to claim 15 wherein the sampling signals are saved in the position measuring system and, after a request signal of the processing unit, the saved sampling signals and the code word are transmitted serially one after the other on the data line to the processing unit.

17. Position measuring device according to claim 16 wherein the position measuring device is an angle measuring device with several code disks, connected together via reducing gear, and sampling signals of lower-resolution code tracks are combined with at least one sampling signal of a higher-resolution code track in the connection logic.

18. Position measuring device with a device for serial data transmission between the position measuring device and a processing unit, the position measuring device comprising a component with a connection logic, in which a code word defining the absolute position is formed from the sampling signals of at least one sampling device, which can be sent to an output component, which brings about a bit-serial transmission of the code word across a data line coupling the position measuring device and processing unit in response to a command (status) sent by the processing unit, the sampling signals forming two code groups with one higher and one lower-resolution code group, and a shift between at least one sampling signal of the higher-resolution code group and a sampling signal of the lower-resolution code group with respect to a nominal position is monitored and when a predetermined tolerance region is exceeded, a warning signal is output.

19. Position measuring device according to claim 18 wherein the shifting of one edge of one of the sampling signals of the lower-resolution code group is monitored, checking to see whether the edge lies within a tolerance region determined by at least one of the sampling signals of the higher-resolution code group.

20. Position measuring device according to claim 19 wherein the tolerance region is half the period of the sampling signal, which has twice the frequency of the sampling signal with lowest resolution of the higher-resolution code group.

21. Position measuring device according to claim 19 wherein the tolerance region is determined by logical combination of several sampling signals of the higher-resolution code group.

22. Position measuring device according to claim 21 wherein the tolerance region is determined by a logical OR operation between the two next higher-resolution sampling signals relative to the sampling signal with lowest resolution of the higher-resolution code group.

* * * * *